United States Patent [19]

Streit et al.

[11] Patent Number: 5,672,522
[45] Date of Patent: Sep. 30, 1997

[54] METHOD FOR MAKING SELECTIVE SUBCOLLECTOR HETEROJUNCTION BIPOLAR TRANSISTORS

[75] Inventors: Dwight Christopher Streit, Seal Beach; Michael Lammert, Manhattan Beach; Aaron Kenji Oki, Torrance, all of Calif.

[73] Assignee: TRW Inc., Redondo Beach, Calif.

[21] Appl. No.: 611,117

[22] Filed: Mar. 5, 1996

[51] Int. Cl.[6] .................................................. H01L 21/265
[52] U.S. Cl. .......................... 437/31; 437/24; 437/26; 437/33; 437/133; 148/DIG. 10; 148/DIG. 11; 148/DIG. 72
[58] Field of Search ............................ 437/24, 26, 29, 437/31, 33, 133; 148/DIG. 10, 11, 72

[56] References Cited

U.S. PATENT DOCUMENTS

| | | |
|---|---|---|
| 3,780,359 | 12/1973 | Dumke et al. . |
| 4,029,522 | 6/1977 | De La Moneda . |
| 4,081,292 | 3/1978 | Aoki et al. . |
| 4,789,643 | 12/1988 | Kajikawa . |
| 4,954,457 | 9/1990 | Jambotkar ............... 437/133 |
| 4,967,253 | 10/1990 | Jambotkar ............... 357/344 |
| 4,975,126 | 12/1990 | Margali et al. .......... 437/24 |
| 5,028,549 | 7/1991 | Chang et al. ............ 437/24 |
| 5,041,393 | 8/1991 | Ahrens et al. ........... 437/133 |
| 5,064,772 | 11/1991 | Jambotkar ............... 437/31 |
| 5,070,028 | 12/1991 | Tews et al. .............. 437/24 |
| 5,098,853 | 3/1992 | Clark et al. . |
| 5,162,243 | 11/1992 | Streit et al. . |
| 5,242,843 | 9/1993 | Aina . |
| 5,243,207 | 9/1993 | Plumton et al. ......... 257/192 |
| 5,252,143 | 10/1993 | Chiang et al. . |
| 5,283,448 | 2/1994 | Bayraktaroglu . |
| 5,286,997 | 2/1994 | Hill . |
| 5,298,438 | 3/1994 | Hill ........................ 437/31 |
| 5,336,909 | 8/1994 | Katoh et al. . |
| 5,362,657 | 11/1994 | Henderdon et al. ..... 148/DIG. 72 |

OTHER PUBLICATIONS

Yang, "Microelectronic devices", 1988, pp. 180–183.
Song et al., "Self-Aligned InAlAs/InGaAs Heterojunction Bipolar Transistor with A Buried Subcollector Grown by Selective Epitaxy," *IEEE Electron Device Letters*, vol. 15, No. 4, Apr. 1994, pp. 123–125.

*Primary Examiner*—John Niebling
*Assistant Examiner*—Long Pham
*Attorney, Agent, or Firm*—Michael S. Yatsko

[57] ABSTRACT

A method for fabricating an HBT in which the subcollector-base junction, which contributes to the base-collector capacitance of the device, is reduced by using a selective subcollector. In particular, subcollector areas of the device that do not contribute to collector resistance reduction are eliminated, thereby reducing the subcollector area, which, in turn, reduces the base-collector capacitance. As such, the maximum power-gain frequency $f_{max}$ is increased.

7 Claims, 8 Drawing Sheets

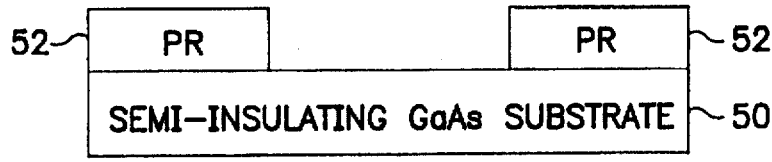
FIG. 5A
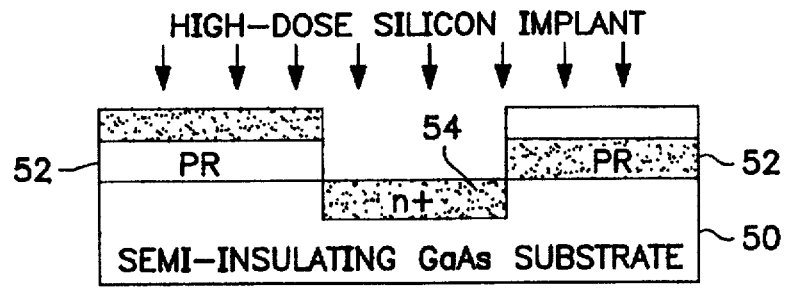
FIG. 5B
FIG. 5C
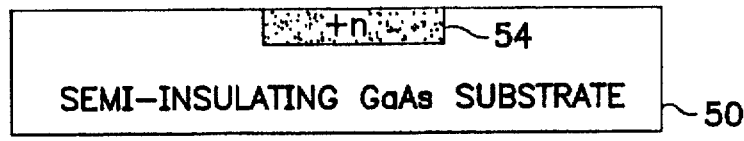
FIG. 5D
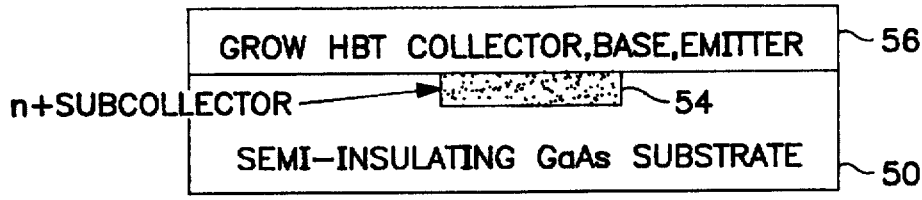
FIG. 5E
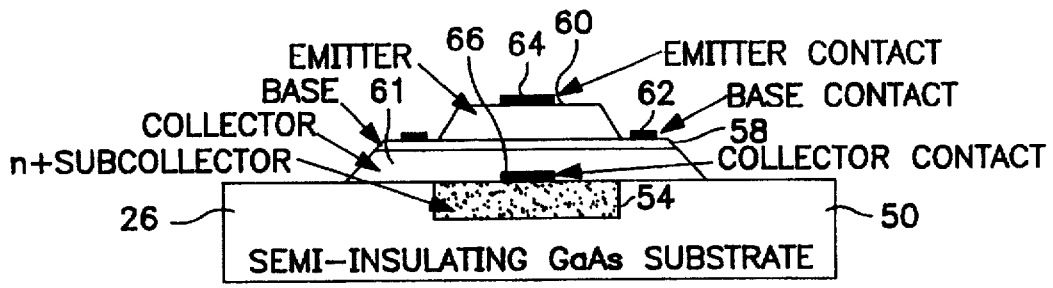
FIG. 5F

METHOD FOR MAKING SELECTIVE SUBCOLLECTOR HETEROJUNCTION BIPOLAR TRANSISTORS

BACKGROUND OF THE INVENTION

1. Field of the Invention

The present invention relates to heterojunction bipolar transistors (HBTs) and more particularly to HBTs with reduced base-collector capacitance which improves the maximum power gain frequency $f_{max}$.

2. Description of the Prior Art

Heterojunction bipolar transistors (HBTs) are used in various microwave applications due to the intrinsic high-linearity and high-efficiency of such devices. The gain of an HBT is determined by the maximum power gain frequency $f_{max}$. The maximum power gain frequency $f_{max}$ is a function of the base-collector capacitance of the device as given by equation (1) below:

$$f_{max} = [f_T/8\pi R_b C_{bc}]^{1/2}; \qquad (1)$$

where $R_b$ is the base resistance and $f_T$ is the unity current gain or cut-off frequency.

HBTs are generally known in the art. Examples of such devices are disclosed in U.S. Pat. Nos. 3,780,359; 4,789,643; and 5,098,853. Various techniques are known for reducing the base-collector capacitance of such HBTs in order to improve the maximum power gain frequency $f_{max}$. Such techniques are disclosed in U.S. Pat. Nos. 5,298,438; 4,029,522; 5,242,843; 5,252,143; 4,081,292; 5,336,909; and 5,286,997; all herein incorporated by reference. A method for improving the base-collector capacitance of an HBT is also disclosed in "Self-Aligned InAlAs/InGaAs Heterojunction Bipolar Transistor with a Buried Subcollector Grown by Selective Epitaxy," by Jong-in Song, Michel R. Frei, John R. Hayes, Raj Baht and Herbert M. Cox, *IEEE Electron Device Letters*, Vol. 15, No. 4, April 1994, pp. 123-125; herein incorporated by reference.

The various techniques disclosed in the prior art, however, are rather complicated and thus add to the complexity of the manufacturing process. For example, U.S. Pat. No. 5,298,438 discloses an HBT in which the layer beneath the base is selectively etched in order to reduce the area of the junction between the base and the underlying layer. In one disclosed method, an epitaxial layer is disposed in a layer beneath the base. The epitaxial layer is selectively removed during fabrication. In a second method, a doping-selective etch is used to remove N-type material for NPN-type transistors (vice versa for p-type material), which does not remove a p-type material. In the second method, ion implantation is used to convert an upper portion of the collector in the extrinsic base region to the same doping type as the base to reduce the extrinsic base resistance. The base-collector capacitance is not affected by the implant since the implanted material is separated by the collector by the air gap produced by the undercut etch.

U.S. Pat. No. 4,029,522 relates to HBTs, fabricated with ion-implanted layers with relatively abrupt edges which serve to reduce the parasitic resistance of both Schottky barrier FETs, as well as bipolar transistors. Essentially, various layers are implanted in the semiconductor substrates with asymmetrical edges. Lift-off techniques are used to make ion-stopping masks with near-vertical sidewalls, used to form the abrupt edges of the ion-implanted layers.

U.S. Pat. No. 5,242,843 relates to a method for making HBTs with an improved high-frequency response. More specifically, a sub-collector layer of a first semiconducting material is deposited on a semi-insulating layer also formed of a semiconducting material. The subcollector layer is a patterned using normal photolithographic processes and overlaid with a relatively thick layer of an insulating material, such as $SiO_2$. The insulating layer is etched using an inverse emitter mesa mask to form a hole in the insulating material. The structure is then placed in an organometallic vapor phase epitaxy system where an n+ layer of a second type of semiconducting material is grown on the surface of the subcollector layer within the hole and an n-type layer of a second type of semiconducting material is grown on the top surface to form a collector. A p+-type layer of a first type of semiconducting material is then grown epitaxially on an n-type layer to form a base. As a result of the organometallic vapor phase epitaxy, lateral growth rate is greater than a vertical growth rate, such that the layers grown on the base form a mushroom-shaped mesa; the periphery of which overhangs the insulating material such that the extrinsic base and collector regions are separated by a layer of insulating material which reduces the extrinsic base-collector capacitance significantly.

U.S. Pat. No. 5,252,143 also discloses an HBT with reduced base-collector capacitance. In particular, a preprocessed substrate structure, which includes a substrate of a semiconductor material, such as a p-silicon, a subcollector layer of a semiconductor material, such as an n+ silicon, a dielectric disposed between the subcollector and the substrate with the window therethrough and a feed-through layer of epitaxial semiconductor material formed in the window. In this device, the dielectric serves as an intervening layer that spaces the subcollector layer from the substrate. In an alternate embodiment, the area of contact between the feed-through layer and the substrate is made smaller than the area of the active region of the semiconductor to further reduce the base-collective capacitance.

U.S. Pat. No. 4,081,292 discloses a method for manufacturing a semi-insulating silicon layer. In particular, a p-type base region and an n+-type emitter region are diffused into an n-type silicon substrate. A $SiO_2$ layer is used as a mask for emitter and base diffusions.

SUMMARY OF THE INVENTION

It is an object of the present invention to solve various problems associated with the prior art.

It is yet a further object of the present invention to provide a method for fabricating a heterojunction bipolar transistor (HBT) with reduced base-collector capacitance $C_{bc}$ in order to improve maximum power-gain frequency $f_{max}$.

Briefly, the present invention relates to a method for fabricating an HBT in which the subcollector-base junction, which contributes to the base-collector capacitance of the device, is reduced by using a selective subcollector. In particular, subcollector areas of the device that do not contribute to collector resistance reduction are eliminated, thereby reducing the subcollector area, which, in turn, reduces the base-collector capacitance. As such, the maximum power-gain frequency $f_{max}$ is increased without affecting the cut-off frequency $f_T$.

BRIEF DESCRIPTION OF THE DRAWING

These and other objects of the present invention will be readily understood with reference to the following specification and attached drawing, wherein:

FIGS. 5a–5f are cross-sectional elevational views illustrating the various stages of a second embodiment of a fabrication method in accordance with an alternate embodiment of the invention;

DETAILED DESCRIPTION OF THE INVENTION

The present invention relates to a heterojunction bipolar transistor (HBT) and a method for making an HBT in which the base-collector capacitance is reduced in order to improve the maximum power gain frequency $f_{max}$. Two embodiments of the invention are illustrated. One embodiment of the invention is illustrated in FIGS. 1–4, while a second embodiment of the invention is illustrated in FIGS. 5–8.

The first embodiment, illustrated in FIGS. 1–4, is based upon oxygen-ion implantation while the embodiment illustrated in FIGS. 5–8 is based on silicon-ion implantation, which effectively eliminates areas of the device that do not contribute to the collector resistance reduction. In both embodiments, the base-collector capacitance is reduced by reducing the area between the base mesa and the subcollector in order to improve the maximum power gain frequency $f_{max}$. More particularly, as discussed above, the maximum power gain frequency $f_{max}$ is defined according to the following equation:

$$f_{max} = [f_T/8 R_b C_{bc}]^{1/2}. \qquad (2)$$

Both embodiments are based upon a selective subcollector that is based on a relatively smaller subcollector area. The base-collector capacitance is defined by equation (3) below:

$$C_{bc} = a_{bc} \epsilon_s / t; \qquad (3)$$

where $a_{bc}$ is the area of the base subcollector capacitor, $\epsilon_s$ is the permittivity of the semiconductor and t is the thickness of the depleted subcollector.

Since the base-collector capacitance is directly proportional to the area of the junction of the base mesa and the subcollector, reducing the effected area of the subcollector will result in a reduction of the base-collector capacitance, which, in turn, will provide an increased maximum power gain frequency $f_{max}$.

Figure 1A:
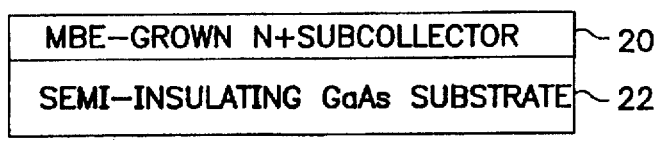
FIGS. 1a–1e are cross-sectional elevational views illustrating the various stages of a first embodiment of a fabrication method in accordance with the present invention.
Figure 1B:
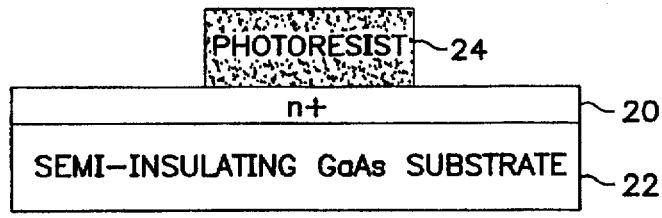
Figure 1C:
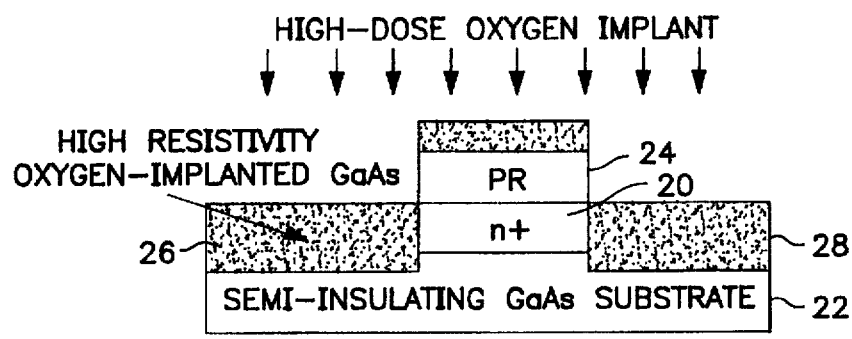

Referring to the first embodiment, an oxygen implantation of an n+ subcollector layer is used to limit the area of the subcollector. Referring to FIGS. 1a–1e, an n+ subcollector, grown, for example, by molecular beam epitaxy (MBE), identified with the reference numeral 20, is grown on a semi-insulated GaAs substrate 22. The subcollector 20 may be, for example, a 0.6 μm thick silicon doped GaAs layer with a doping concentration of $n=3 \times 10^{18}$ cm$^{-3}$. Rather than growing the remainder of the epitaxial HBT structure in a known fashion, the subcollector layer 20 is removed from the MBE system and patterned with a photo-resist 24, as illustrated in FIG. 1b. As shown in FIG. 1c, the portions 26 and 28, not covered by the photo-resist 24, are implanted using oxygen ions as illustrated in FIG. 1c. The areas protected by the photo-resist 24 remain relatively highly conductive while the areas 26 and 28 exposed to the oxygen-ion implantation are relatively highly resistive.

A relatively high-dose implant schedule is used to allow the oxygen-ion implanted areas 26 and 28 of the subcollector 20 to remain highly resistive following the MBE growth 30 shown in FIG. 1d and discussed in more detail below. A plurality of acceleration energies varying from about 40 keV to about 350 keV are used for the oxygen-ion implant as shown in FIG. 2. Normal oxygen-ion implant schedules used for device isolation are not satisfactory in this application since such normal schedules would result in the implanted regions 26 and 28 of the subcollector being conductive following the MBE growth layer 30 discussed below. An oxygen profile for forming the relatively highly resistive implanted areas 26 and 28 is illustrated in FIG. 2.

Figure 1D:
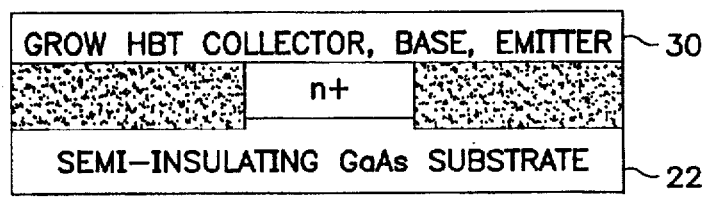
Figure 1E:
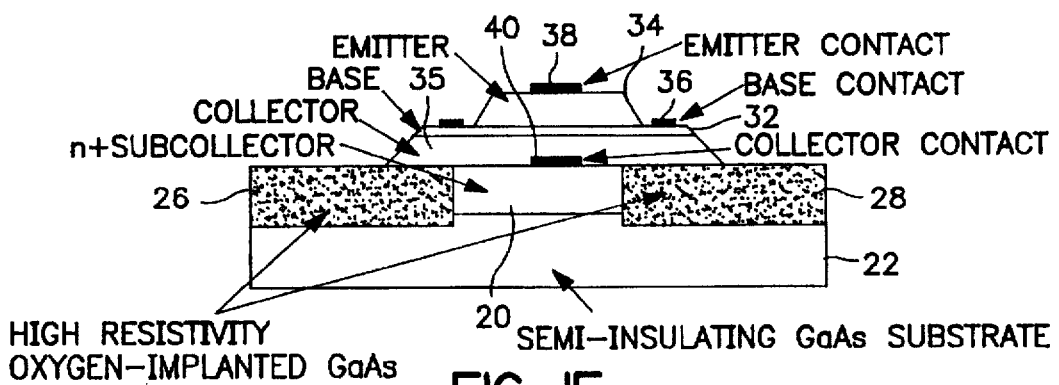
Figure 2:
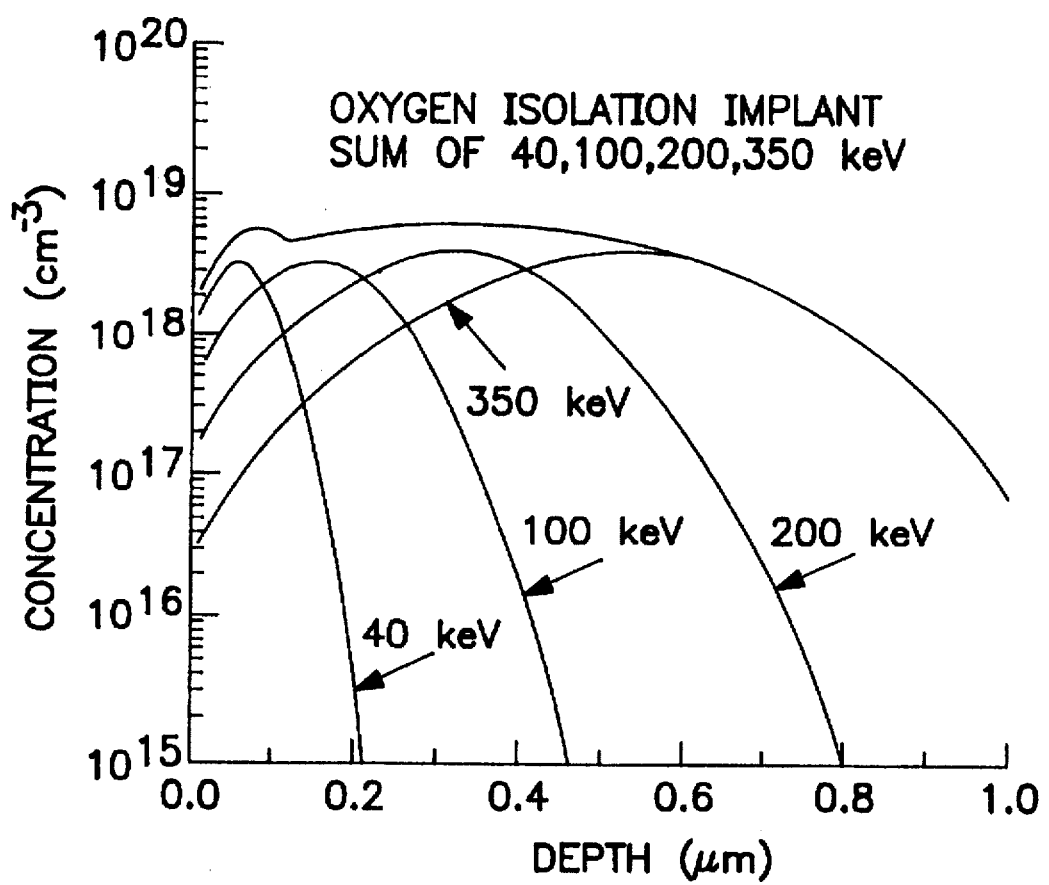
FIG. 2 is a graphical illustration of the oxygen-ion implantation concentration as a function of the depth for various acceleration energies between 40 keV–350 keV.

Turning to FIG. 1d, after the oxygen-ion implantation, the photo-resist 24 is removed to enable the collector, base and emitter layer (generally identified with the reference numeral 30) to be grown over the oxygen ion implanted areas 26 and 28 and the subcollector 20 as illustrated in FIG. 1d. A thin, ~50 Å n$^+$ GaAs layer doped $3 \times 10^{18}$ cm$^{-3}$ with silicon may be used at the collector/subcollector interface to reduce interface Fermi-level pinning effects on the collector quasi-electric field. The collector, base emitter layer 30 may be grown to a thickness of approximately 1.1 μm. Conventional processing, for example, as described in detail in U.S. Pat. No. 5,162,243, hereby incorporated by reference, is used to form the base, collector and emitter regions and in particular, base and emitter mesas 32 and 34, respectively, the collector 35 as well as the base, emitter and collector ohmic 36, 38 and 40, respectively.

Figure 3:
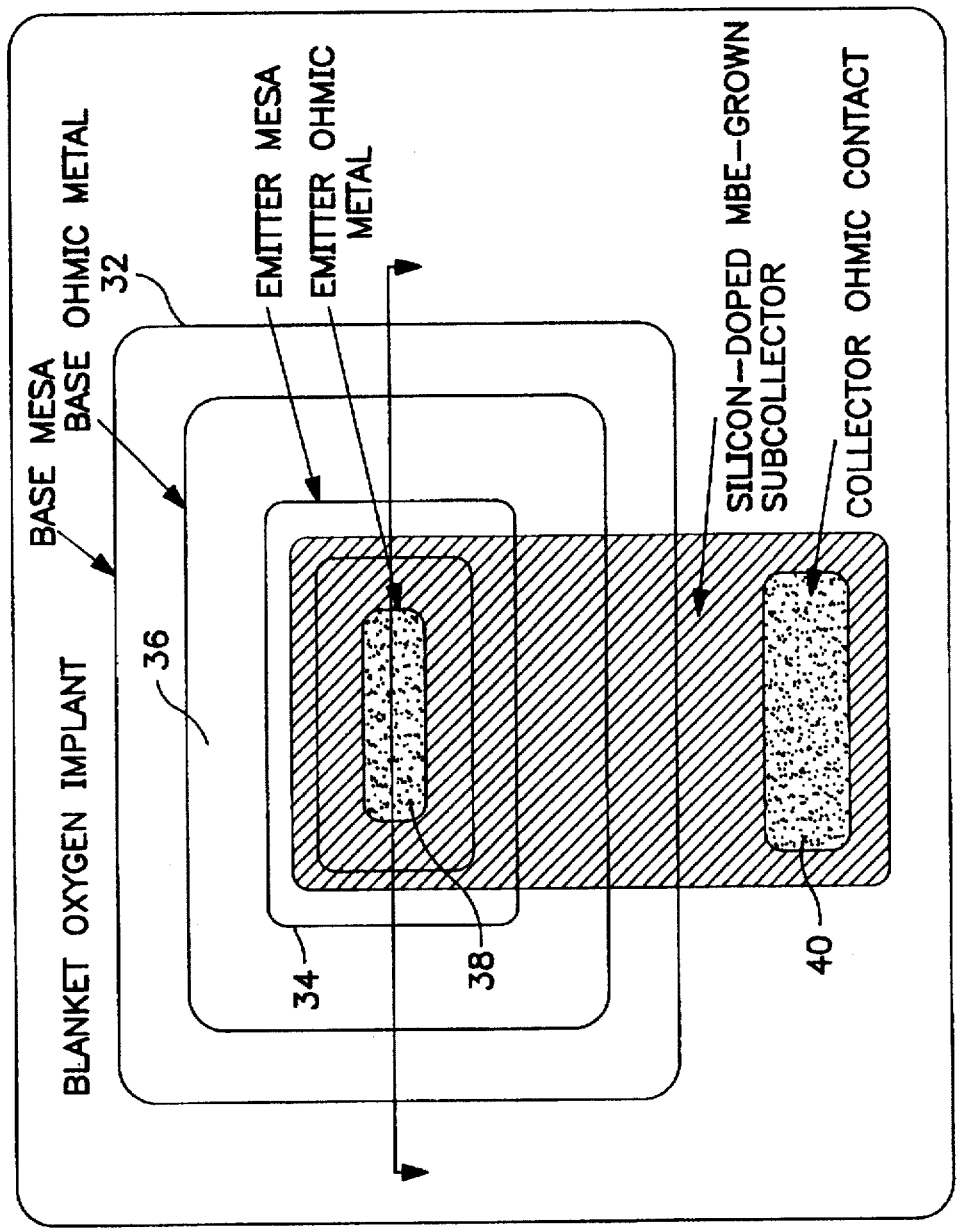
FIG. 3 is a plan view of an HBT fabricated in accordance with the method illustrated in FIG. 1.
Figure 4:
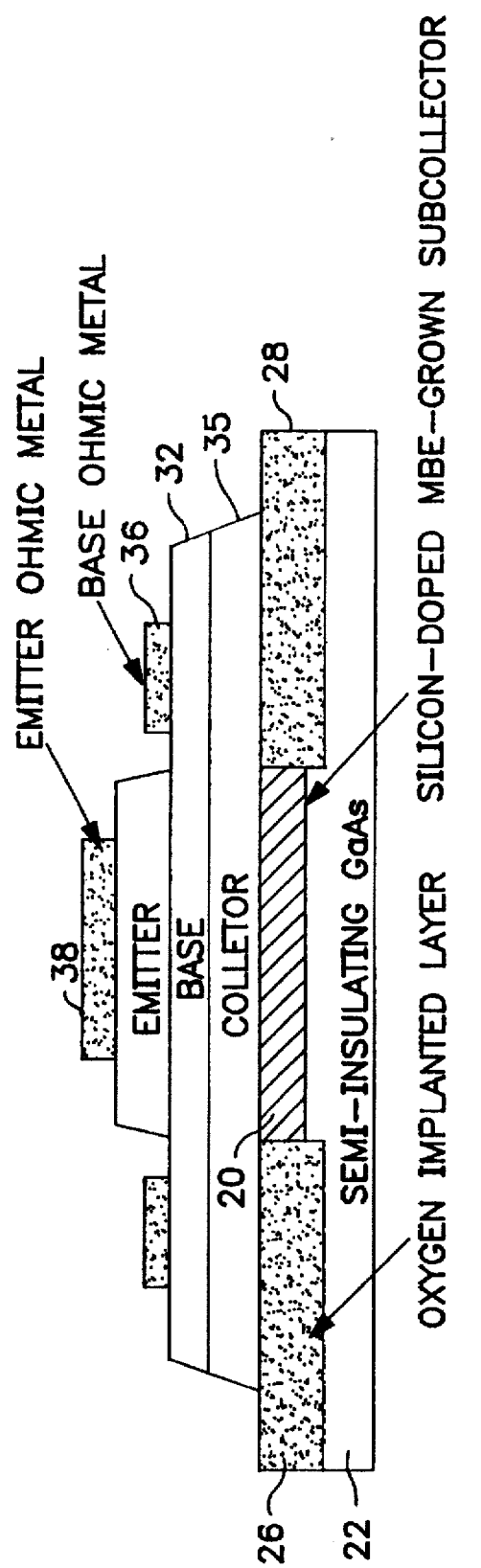
FIG. 4 is a cross-sectional view of the HBT illustrated in FIG. 3 along line 4—4.

As shown in FIGS. 3 and 4, the base-collector capacitance $C_{bc}$ is reduced to about 25 percent of its original value. As mentioned above, by reducing the area of the subcollector 20, the area of the junction of the subcollector and base mesa 32 is reduced, which, in turn, reduces the effective base-collector capacitance $C_{bc}$. By reducing the base-collector capacitance $C_{bc}$, the maximum power gain frequency $f_{max}$ is proportionally increased.

FIGS. 5–8 represent an alternate body of the invention. The alternate embodiment illustrated in FIGS. 5–8, similar to the first embodiment, is based upon a selective subcollector, but uses a selectively silicon-implanted layer to reduce the area of the subcollector. In particular, referring to FIGS. 5a and 5b, a virgin semi-insulating GaAs substrate 50, for example 625 μm thick, is coated with photo-resist 52, as illustrated in FIG. 5b.

Figure 6:
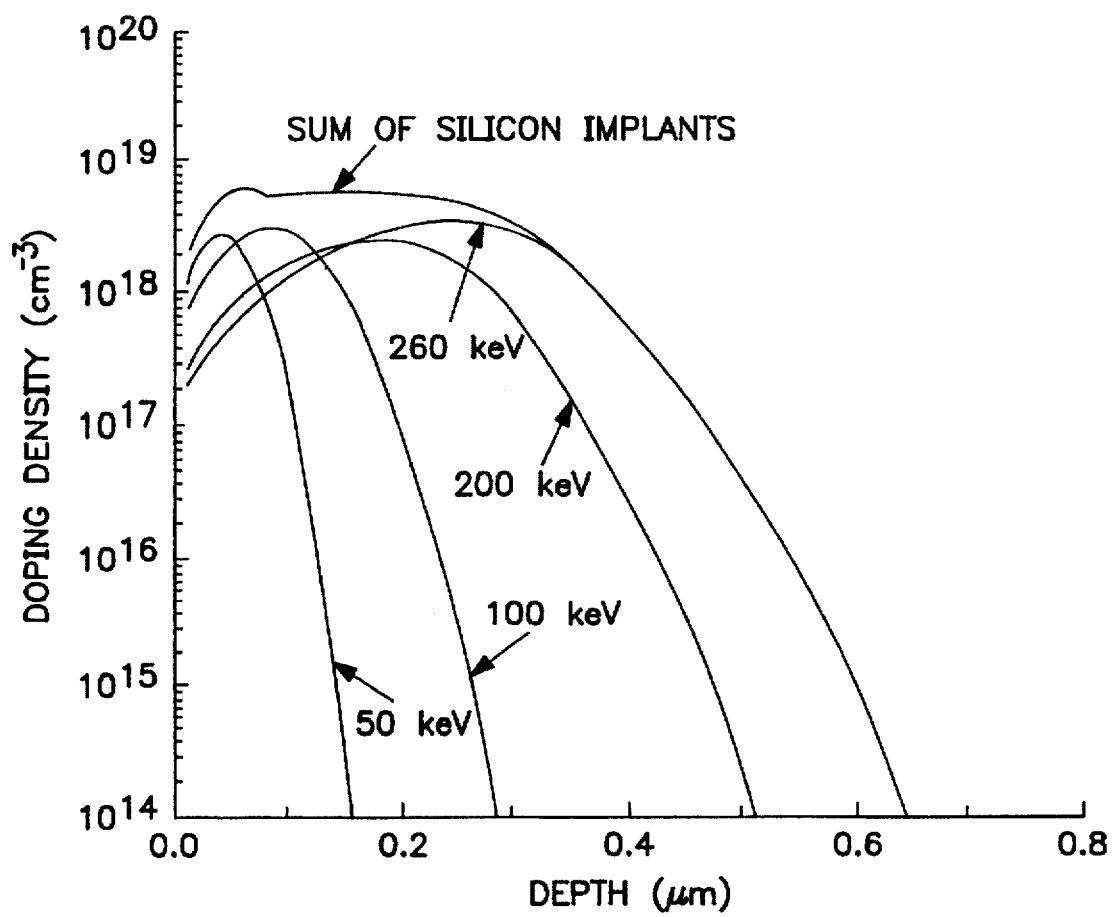
FIG. 6 is a graphical illustration of the doping density as a function of the depth of the silicon implants for various acceleration energies from 50 keV–260 keV.

As shown in FIG. 5c, silicon-ion implantation is used to make selectively conducting subcollector region 54 in the surface of the substrate as illustrated in FIG. 5c. The silicon-implant profile is illustrated in FIG. 6 and as shown is done with a plurality of acceleration energies varying between 50 keV and 260 keV. The photo-resist 52 is then stripped, as illustrated in FIG. 5d. Once the photoresist 52 is stripped, a collector, base and emitter layer 56 is formed in a conventional manner as discussed above, for example, to a thickness of 1.1 μm, as shown in FIG. 5e. After the collector, base and emitter layer 56 is grown, base, emitter and collector regions formed as base and emitter mesas 58 and 60, a collector 61, as well as base, emitter and collector ohmic metal contacts 62, 64 and 66, are formed in a conventional manner as discussed above.

Figure 7:
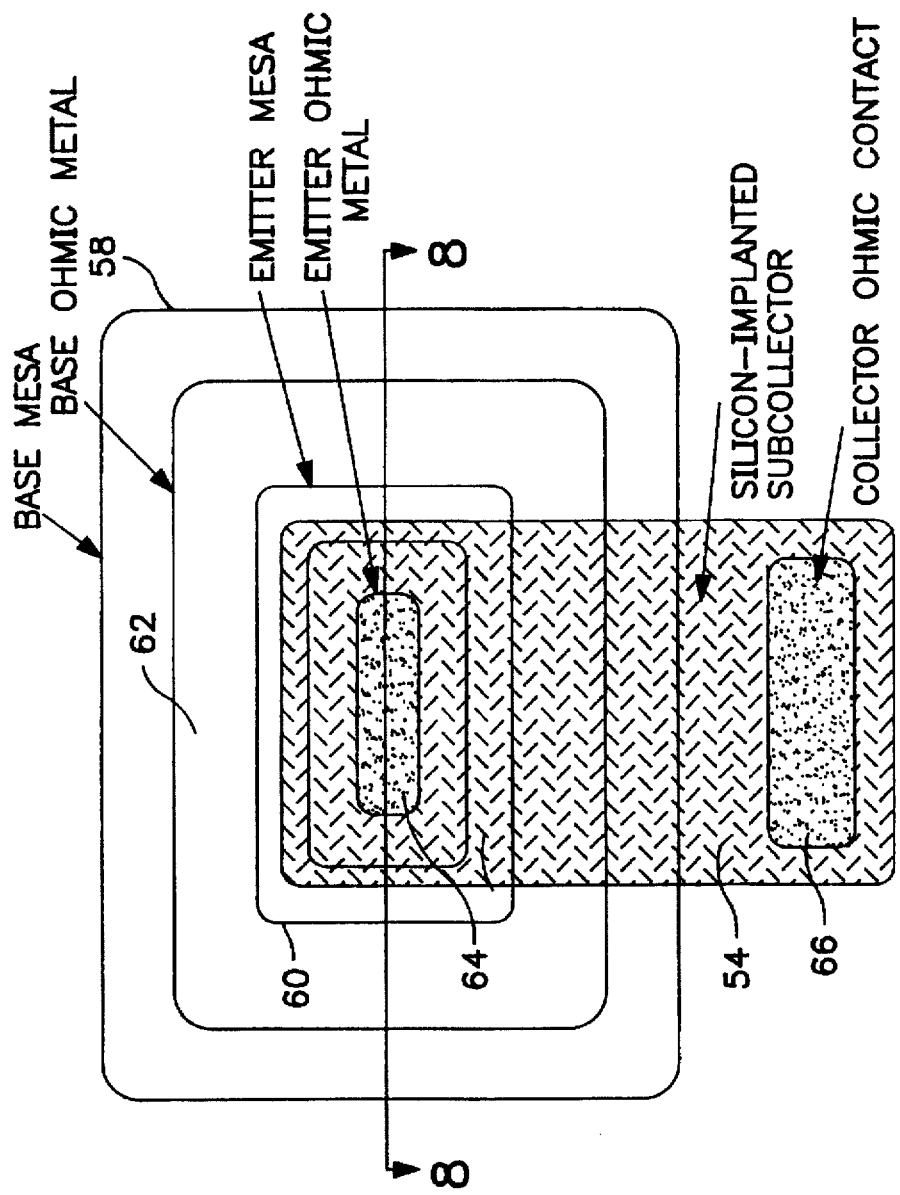
FIG. 7 is a plan view of an HBT fabricated in accordance with the method illustrated in FIG. 5.
Figure 8:
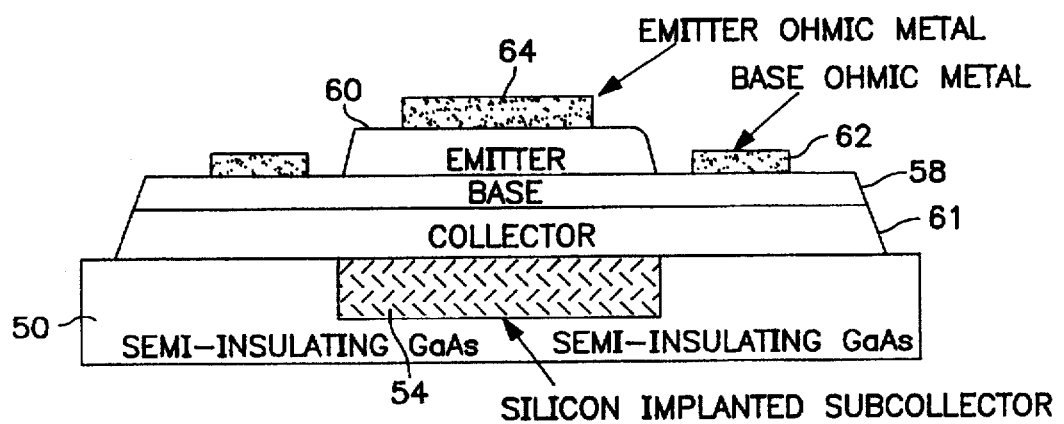
FIG. 8 is a cross-sectional view of the HBT illustrated in FIG. 7 along line 8—8.

As shown in FIGS. 7 and 8, the silicon-implant profile results in a subcollector-base junction that is only about 40 percent of the area of the original subcollector-base junction, which provides an increase in the maximum power gain frequency $f_{max}$ by about 50 percent.

Both of the techniques described above are applicable to heterojunction bipolar transistors including GaAs-AlGaAs, GaAs-InGaP, InGaAs-InAlAs and InGaAs-InP material systems. The material can be fabricated by other molecular beam epitaxy or metal organic chemical vapor deposition techniques, both of which are well known in the art.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A method for fabricating a heterojunction bipolar transistor (HBT) with an increased maximum power gain frequency, comprising the steps of:

(a) providing a substrate;

(b) patterning a photo-resist over a portion of said substrate;

(c) implanting silicon ions in a portion of said substrate not covered by said photo-resist, forming a subcollector;

(d) forming collector, base and emitter regions over said subcollector; and (e) forming ohmic contacts on said collector, base and emitter regions.

2. A method as recited in claim 1, wherein said substrate is GaAs.

3. A method as recited in claim 1, wherein an acceleration energy of about 50 keV or greater is used for silicon-ion implantation.

4. A method as recited in claim 1, wherein a plurality of acceleration energies are used for said silicon-ion implantation.

5. A method as recited in claim 4, wherein each of said plurality of acceleration energies is greater than about 50 keV.

6. A method as recited in claim 4, wherein said plurality of acceleration energies vary about 50 keV to about 260 keV.

7. A method as recited in claim 1, wherein said subcollector is an N+ type material.

* * * * *